United States Patent [19]
Hügl et al.

[11] Patent Number: 5,626,777
[45] Date of Patent: May 6, 1997

[54] PROCESS FOR PRODUCING DIVIDABLE PLATES OF BRITTLE MATERIAL WITH HIGH ACCURACY AND APPARATUS FOR RECEIVING AND PRECISION-GRINDING THE END FACES OF A PLATE

[75] Inventors: Kurt Hügl; Roland Leneis, both of Marktredwitz, Germany

[73] Assignee: Hoechst CeramTec AG, Selb, Germany

[21] Appl. No.: 203,417

[22] Filed: Mar. 1, 1994

[30] Foreign Application Priority Data

Mar. 2, 1993 [DE] Germany .......................... 43 06 296.2
Dec. 24, 1993 [DE] Germany .......................... 43 44 383.4

[51] Int. Cl.$^6$ ............... B23K 26/00; B26F 3/02; B26F 3/16
[52] U.S. Cl. ................ 219/121.72; 219/121.71; 225/2
[58] Field of Search .......... 219/121.67, 121.68, 219/121.69, 121.7, 121.71, 121.72; 225/2, 93.5, 94

[56] References Cited

U.S. PATENT DOCUMENTS

| | | | |
|---|---|---|---|
| 3,556,366 | 1/1971 | Kim | 225/93.5 |
| 3,687,345 | 8/1972 | Carlson et al. | 225/2 |
| 3,814,895 | 6/1974 | Fredriksen | 219/121.68 |
| 4,224,101 | 9/1980 | Tijburg et al. | 219/121.69 |
| 4,352,446 | 10/1982 | Young | 225/2 |
| 4,918,284 | 4/1990 | Weisz | 219/121.69 |
| 5,063,280 | 11/1991 | Inagawa et al. | 219/121.7 |
| 5,214,261 | 5/1993 | Zappella | 219/121.67 |

FOREIGN PATENT DOCUMENTS 2-18903   1/1990   Japan .......................... 225/2

*Primary Examiner*—Geoffrey S. Evans
*Attorney, Agent, or Firm*—Foley & Lardner

[57] ABSTRACT

A process for producing a plate from a brittle material which can be individually separated by breaking to form one or more smaller platelets. In this process, laser scoring is used to produce in a single plate of large dimensions a parallel first predetermined breaking points respectively at the distance $d_a$ and b parallel second predetermined breaking points respectively at the distance $d_b$, which intersect the first predetermined breaking points, a and b being integers over 1. The edge zone is removed in the outer region at the distance $d_a$ from the two outer first predetermined breaking points and at the distance $d_b$ from the two outer second predetermined breaking points, so that the remaining plate, without border pieces, contains $(a-1) \times (b-1)$ platelet sections of the same size, which are bounded by in each case four predetermined breaking points.

13 Claims, 5 Drawing Sheets

PROCESS FOR PRODUCING DIVIDABLE PLATES OF BRITTLE MATERIAL WITH HIGH ACCURACY AND APPARATUS FOR RECEIVING AND PRECISION-GRINDING THE END FACES OF A PLATE

The invention relates to a process for the cost-effective production of high-grade, preferably multiply divided, lasered plates from brittle, in particular ceramic material, in which a very precise position of geometrical figures, such as for examples lines, clearances and predetermined breaking points, in relation to an outer edge of the plate is achieved in combination with very good edge quality.

Figure 1:
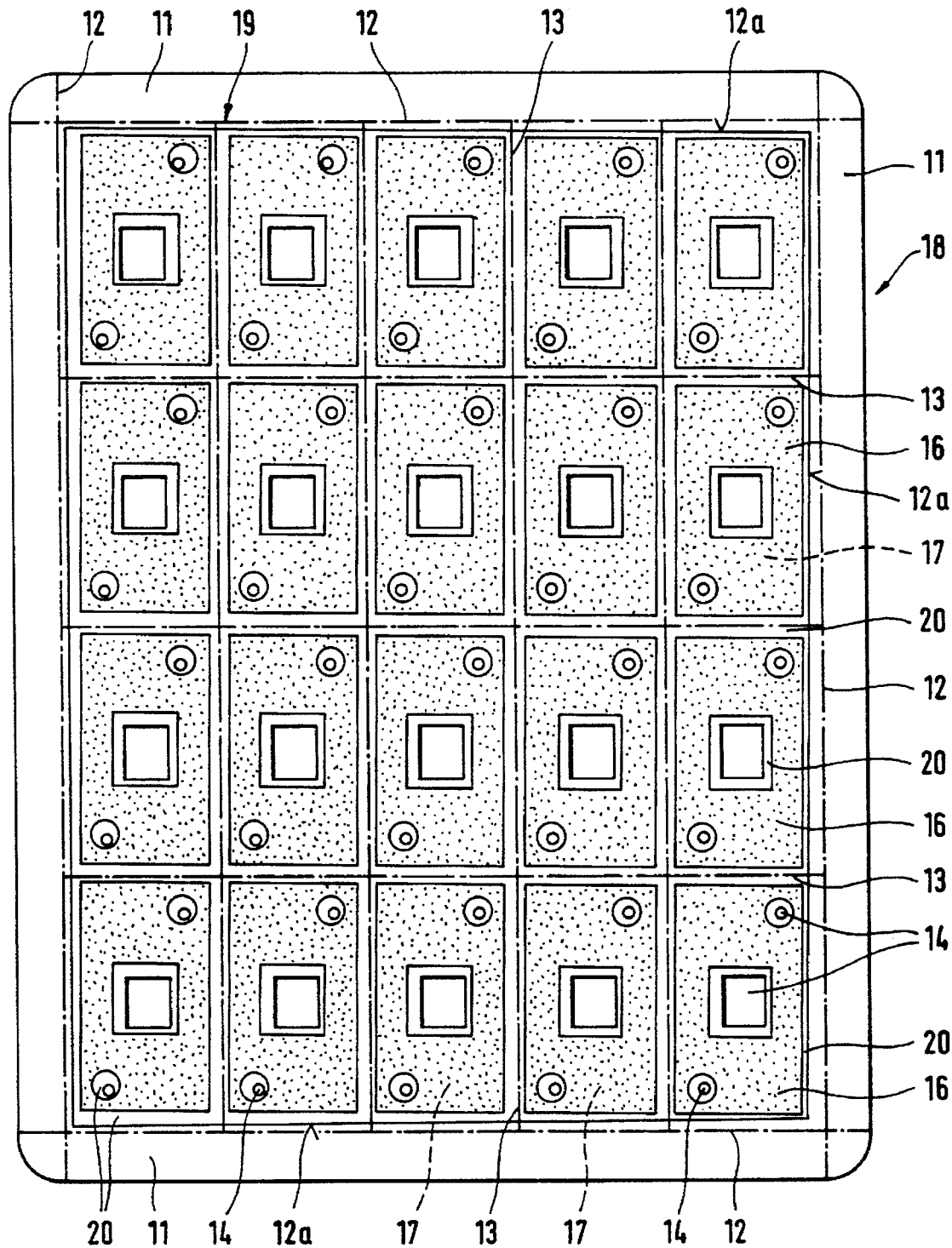

The production of such plates from ceramic material by the process customary in the art is explained with reference to FIG. 1. By this process, in a first laser-working step, an outer predetermined breaking point (12) for an outer contour is scored into a ceramic plate (18) and then the border (11) of the plate is broken off, so that the usable plate (19) remains. Thereafter, the end faces are ground as far as possible at right angles to each other and at right angles to the upper side and under side of (19) and at the same time to size, in order to improve the edge quality. This produces the ground contour (12a). If appropriate, in a second laser-working step, inner predetermined breaking points (13), bores and/or small rectangular clearances (14) can also be made. This process is known by the name "limit-stop lasering". The usable plate (19) according to FIG. 1 is able to be broken up into 20 smaller rectangular platelet sections (17) of the same size by breaking up at the predetermined breaking points (13).

Figure 2:
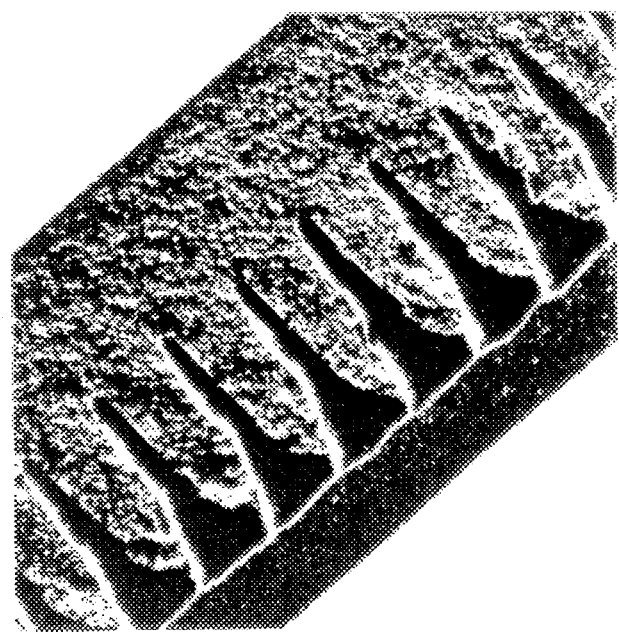
Figure 3:
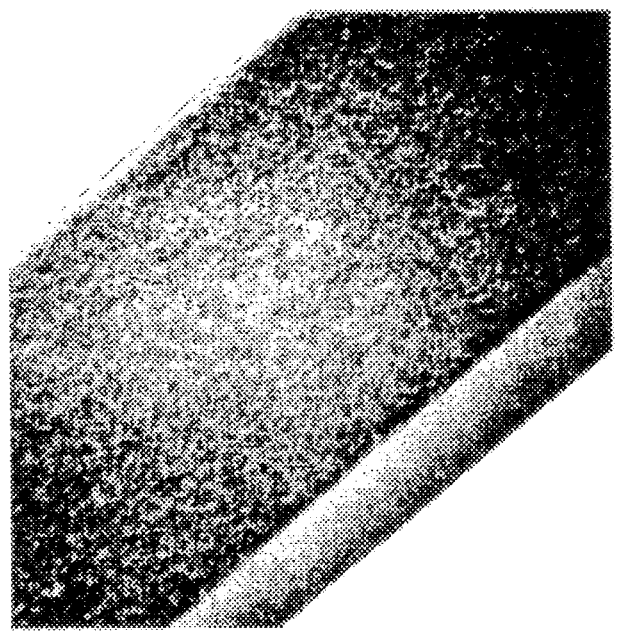

The border (11) serves only for automatic handling, standardizing of the formats and compensating for the slight positional unsharpness in the simultaneous laser treatment of a plurality of plates on a multi-head laser. Breaking off is usually carried out manually. This, and the laser trace itself have the effect of producing in the microstructure a rough, sometimes also longitudinally wavy end face, but in any event an end face undefined with respect to its geometrical microaccuracy. FIG. 2 shows such an end face. Such an end face is very impact-sensitive and can easily break out. The sharp-edged splinters then lie on the surface of the usable plate and, in the case of hybrid production (production of a printed circuit (16) by printing on a metal paste), readily result in gaps in the printed image or even destruction of the printing screen, which has major production losses as a consequence. This end face form, a hinderance to accurate and flawless further processing, must consequently be improved by grinding, in order to create right angles in all three spacial directions and reduce macrowaviness and microwaviness as well as roughness of the rupture surface and break-outs. FIG. 3 shows an end face after grinding.

"Grinding" is understood to mean all processes of machining or material-removing working, including the alternatively possible liquid-jet cutting, which may also be used instead of laser severing.

By improving the end faces, in hybrid production the safety distance (20) between printed image (16) and outer predetermined breaking point (12) can be reduced and consequently, with the same dimensions of the overall plate, the usable surface area of (19) can be increased.

The plates produced in such a way for microelectronics typically have an edge length of 5×5 cm to 20×20 cm, it being possible for an individually separated component (17) from such a plate to be only a few square millimeters in size.

This process has the disadvantage that the plates have to be clamped and reclamped four times for grinding the end faces and that, to compensate for deviations in dimensions and size which occur when breaking off the borders, an oversize of 0.5 mm to 0.7 mm is necessary for grinding.

The plates obtained by the prior art are generally rectangular. A lack of care when breaking off the outer border and when grinding can in this case result in plates on which one edge is skewed (trapezoidal shape) or a plurality of edges are skewed (parallelogram-like shape). If then the inner predetermined breaking points (13) and, if appropriate, clearances (14) are to be made at a later time, the accuracy of the positioning deteriorates. For this case, a safety distance (20) between printed image (16) and outer predetermined breaking point (12) and between (16) and inner predetermined breaking points (13) which is about 0.3 mm on all sides must be maintained. In the case of unground plates, even a safety distance of about 0.5 mm of each edge to be ground and at the predetermined breaking points with respect to the printed image (16) is required. The safety distance must be great enough to allow for angle deviations and parallel displacements of clearances (14), such as for example bores, and inner predetermined breaking points (13) with respect to the ground contour (12a).

In addition, only a relatively coarse printed image of an electric circuit can be printed, because predetermined breaking points (13) and clearances (14) in the interior of (19) must not be met by the conductor tracks of the printed circuit in spite of skewness and positional deviation, or clearances and openings (14) to be plated through have to be met. Furthermore, the plate must, as described, be lasered in two different operations, which causes double the amount of work and setting up and also double handling with additional possibilities of error.

When lasering, heat development and other influences during operation have the effect of producing slight maladjustments and inhomogeneities, which for quality reasons do not allow more than one working head to be used simultaneously in the production of plates described above in the case of multi-head lasers, as are customarily used instead of single-head lasers.

As a result, the possible performance of a laser in the most favorable case is halved (in the case of 2-head lasers), which precludes inexpensive production of divided plates with high dimensional requirements.

The aim of the present invention is to provide an inexpensive process which allows the production of plates of brittle material, in particular rectangular plates, with high accuracy which may also have inner predetermined breaking points (13), clearances (14), such as for example bores, of any design and/or printed images (16) created by metal pastes.

A process has now been found for producing a plate from a brittle material which can be individually separated by breaking to form one or more smaller platelets of predetermined dimensions. The process is one wherein laser scoring is used to produce in a single plate of large dimensions of a brittle material a parallel first predetermined breaking points respectively at the distance $d_a$ and b parallel second predetermined breaking points respectively at the distance $d_b$, which intersect the first predetermined breaking points, a and b being integers over 1, the border zone is removed in the outer region at the distance $d_a$ from the two outer first predetermined breaking points and at the distance $d_b$ from the two outer second predetermined breaking points, so that the remaining plate, without border pieces, contains (a−1)·(b−1) platelet sections of the same size, which are bounded by in each case four predetermined breaking points. All the predetermined breaking points are to pass through the remaining plate, i.e. not end in it. Therefore, the remaining plate contains in its border zone 2·(a+b) platelet sections, which have only 2 or 3 predetermined breaking points.

Preferably ceramic is used as the brittle material of the relatively large single plate. The removal of the border zone may be performed by laser scoring and breaking off, laser cutting or mechanical cutting (sawing, water-jet cutting or similar separating processes). If the border zone is removed by laser scoring and breaking off, the end faces of the usable plate are to be subsequently ground.

The all-sided grinding of the outer contour (12) after breaking off the border is necessary in order to be able later in the production of hybrid circuits to position the printed image (16) of the screen printing exactly and with high angular accuracy with respect to (13) and (14) on the usable plate (19) and to avoid substantially edge splinterings when positioning the plate for screen printing.

Preferably an approximately rectangular relatively large plate is taken first of all and the first and the second predetermined breaking points are arranged in such a way that they run perpendicularly to each other, so that the plate remaining (after removing the border zone) is rectangular and, if appropriate, can be individually separated into a plurality of rectangular platelet sections of the same size.

The process according to the invention readily succeeds in limiting the parallelism deviations of opposing end faces of the useful faces produced by separating and grinding to a maximum of 0.05%, preferably to a maximum of 0.03% of the useful-face edge length.

The process according to the invention is of particular value if it is desired to produce in the small platelet sections at a precise predetermined position at least one hole by laser drilling, at least one clearance by laser cutting and/or a printed electric circuit by screen printing.

If the removing of the border zone is performed by laser cutting ("method 1") or by mechanical sawing off, the grinding process can be dispensed with, since the edges produced are smooth and free from damage. At the same time as producing the outer contour (12) and in the same clamping operation, the clearances (14) and the inner predetermined breaking points (13) can be produced by a multi-head laser.

In the case of another development of the process according to the invention, the procedure adopted is that the plate is laser-scored for removal of the border zone, maintaining during this outer laser scoring a distance which is slightly greater (about 0.1 to 0.2 mm) than the distance $d_a$ or $d_b$, the border zone produced by laser scoring is broken off and the rupture edges of the plate produced during breaking off are ground down until the distance from the next predetermined breaking point is exactly $d_a$ or $d_b$, respectively ("method 2").

In general, a plate or a plurality of plates next to one another is/are positioned on a laser table in a free, but ordered manner. Then, the outer predetermined breaking points (12) are lasered in the interior of the plate (18) and, if appropriate, inner predetermined breaking points (13) and also clearances and bores (14) are lasered in one go by one or more laser heads. After the breaking off of the border (11), the precise cutting or grinding of the end faces is performed. In this case, each individual plate has to be aligned for the grinding operation with reference to the inner contours (13) or the clearances (14) by electronic means, for example photodiodes or a camera and an x-y positioning table.

Since the plate is positioned with reference to the contours of (12), (13) and (14) for grinding, it is ensured that both the angularity and the tolerance in terms of shape and position of the outer predetermined breaking point (12) and inner contours of (13) and (14) with respect to each other on each plate are very close to the working accuracy of the electronic measuring instrument.

Even if, as happens in the case of multi-head lasers, the various laser heads behave differently during operation, the maximum accuracy in the plate and from plate to plate is nevertheless provided by the electronic alignment in the second operation.

In order to avoid the inner predetermined breaking point (13) and clearances (14) being displaced parallel to the outer edges on the useful face and/or lying torsionally distorted, according to another preferred development of the process according to the invention at least three narrow, rectangular clearances are made by laser cutting at the outer predetermined breaking points produced by laser scoring, of which clearances at least two are arranged on the same side and at least one is arranged on a neighboring side. Instead of the clearances, of course it is possible to dispense with the preceding scoring. Preferably, the narrow clearances touch from the outside the outer predetermined breaking points produced by laser scoring, or the center axes of the clearances coincide with the predetermined breaking points.

In general, a multi-head laser is used to produce simultaneously the outer predetermined breaking point (12) of the plate by laser scoring and laser cutting of three stop faces (15) on two neighboring edges together with predetermined breaking points (13) and inner contours of (14).

Figure 4:
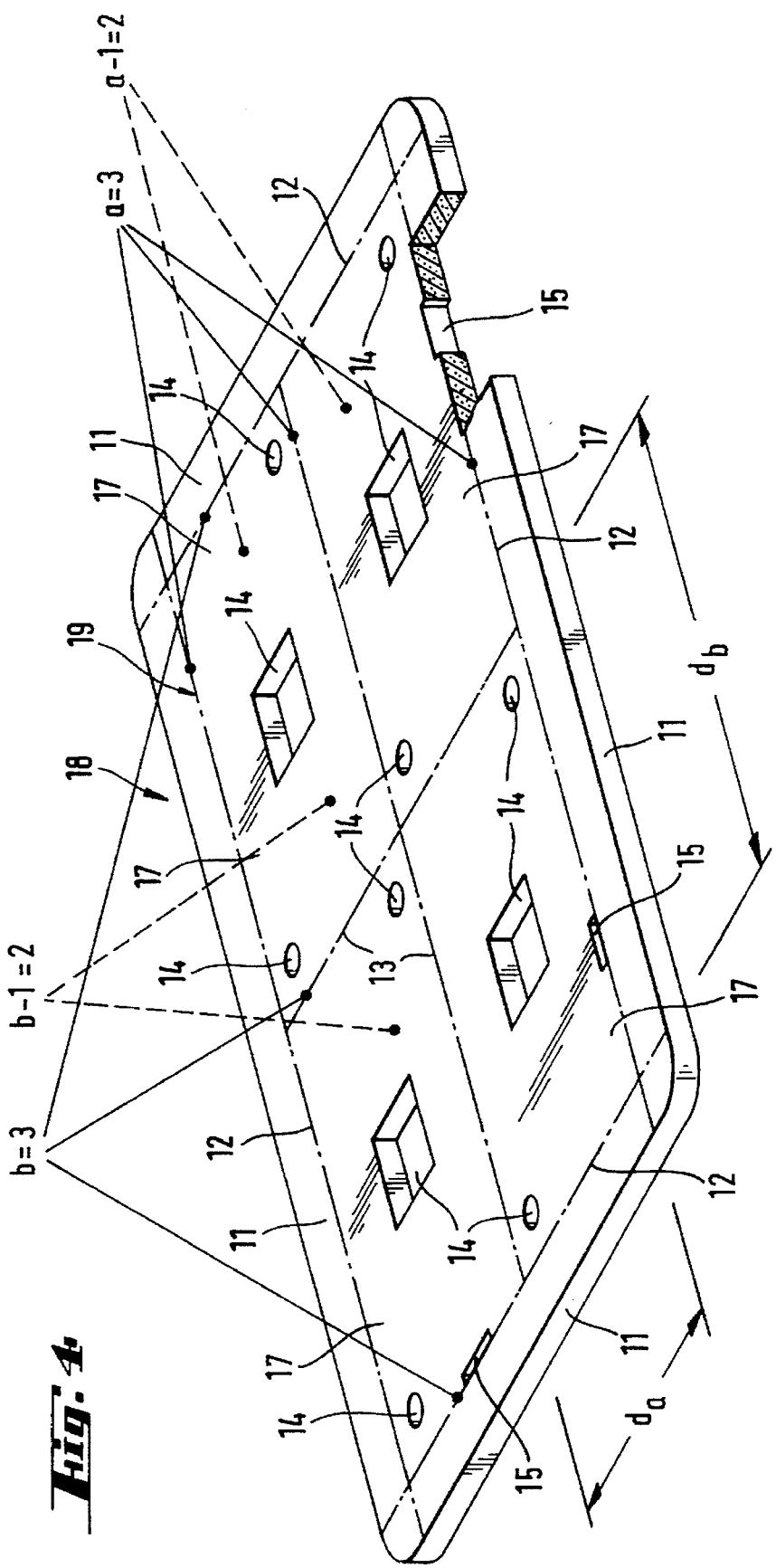

FIG. 4 shows a blank substrate (18) with laser-scored outer predetermined breaking point (12), rupture border (11), laser-scored inner predetermined breaking points (13), laser-cut clearances (14) and three laser-cut edge sections (15). The sections (15) are well-defined and smooth and serve during grinding as stop points.

A single plate prepared by this process can be clamped exactly and reproducibly into a rotary grinding apparatus, the plate can be rotated and all four end faces can be ground exactly to size and angularity, without releasing the clamping.

However, the process is commercially of particular interest if a multiplicity of rectangular plates of which the border zone produced by laser scoring has been broken off are stacked one on top of the other in such a way that the contours of corresponding narrow clearances lie one above the other, the stack is compressed and corresponding outer contours of the rectangular plates are straightened simultaneously by grinding ("method 3").

Figure 5:
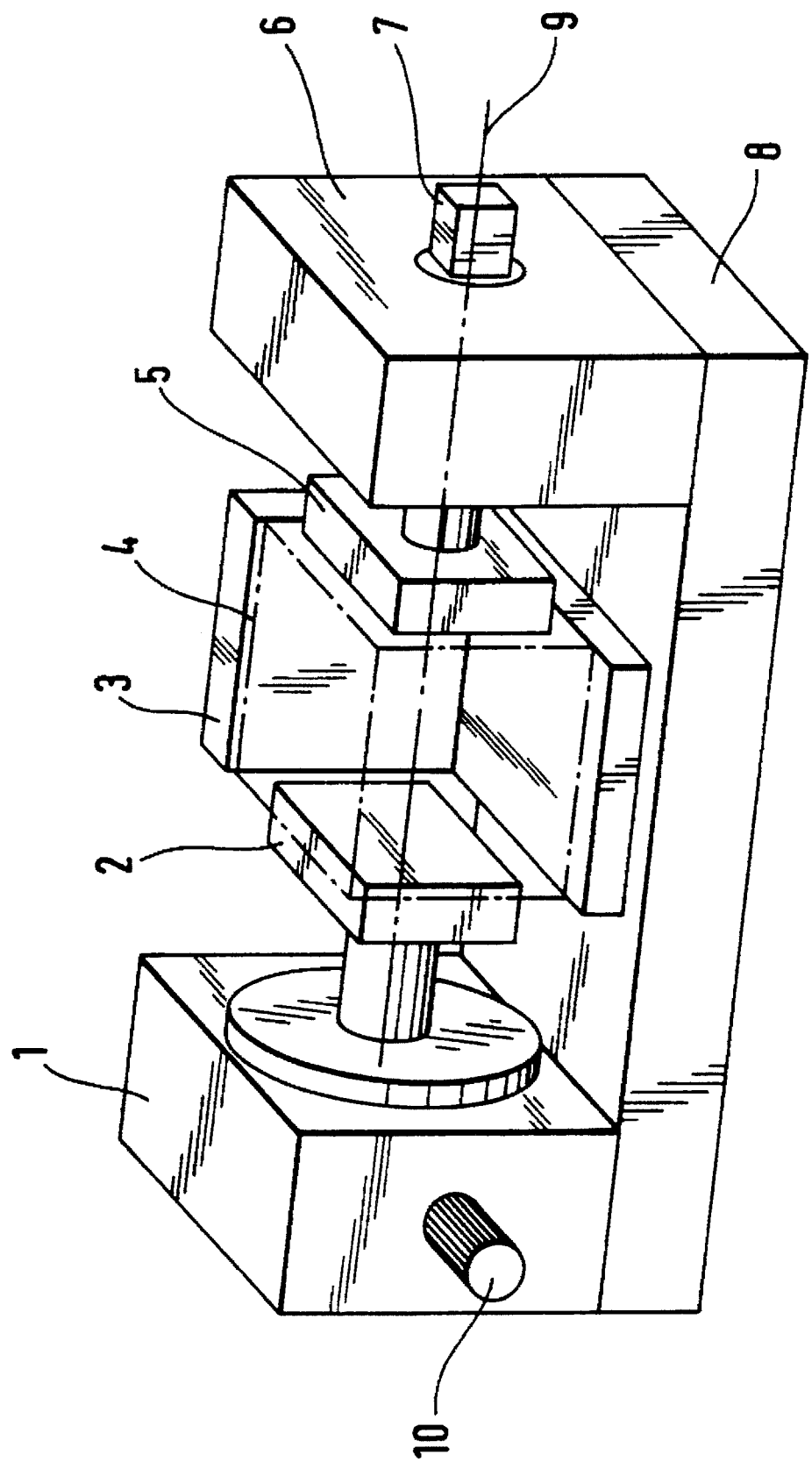

An apparatus according to the invention for receiving and precision grinding rectangular plates which is well suited for the process is described in more detail below with the aid of FIG. 5.

In this figure:

| | |
|---|---|
| Item 1 | represents a precision dividing device having a clamping jaw (2) which is situated in a plane perpendicular to the axis (9), is rotatable about this axis and can be arrested by means of the screw (10) at a predetermined rotational angle; |
| Item 3 | represents a placing-in device having two receiving faces, situated perpendicularly to each other, for the positionally and angularly accurate placing in of at least one plate on which the border (11) has been removed. This placing-in device lies loosely on the baseplate (8); |

| | |
|---|---|
| Item 4 | represents space for at least one plate which is to be ground; |
| Item 5 | represents a clamping jaw which can be moved in the direction of the axis (9), can be rotated about the latter, is mounted rotatably in the abutment (6) and can be moved by means of a spindle (7) in the axial direction; |
| Item 8 | represents the baseplate of the apparatus, which can be arrested fixedly on a table by means of clamping claws or a magnetic clamping table. |

Not drawn is a grinding unit for the grinding down of the edges (end faces) of the stack of plates or of the plate. These end faces are to run as far as possible perpendicularly to the surface of the plate.

The clamping jaws (2) and (5) represent pressure contacts which firmly hold an individual plate or press together a plurality of plates on their surfaces as a stack. The axis of rotation preferably runs through the center points of the rectangles of the plates, because then the effort for adjusting the distance of the grinding apparatus during operation is at its least.

Either the grinding unit or the clamping mechanism (1, 2, 5) with the two clamping jaws which hold the stack of plates is preferably arranged linearly movably, in order that the effective surface of the grinding apparatus can slide past along the end faces of the stack of plates in a grinding manner. The effective grinding face is to be able to execute a motion in a plane which runs parallel to the axis of rotation of the clamping jaws (=pressure contacts 2, 5).

With the aid of the clamping jaws (2 and 5) and the placing-in device (3), plates which have been completely lasered and broken to blank dimensions are arranged in the space (4) and clamped for grinding in between the clamping jaws (2) and (5) which can rotate about the horizontal axis (9).

The auxiliary device (3) preferably contains stop locations, in particular of hard materials. This is advisable if the plates to be ground already have three cut-through edge sections (15). This development permits the exact alignment of the usable plate parallel to the machine table.

After clamping in, the placing-in device (3) is removed and the first end face of a plate is ground. After completion of this end face, the plate or the stack of plates is swivelled through 90° in the clamped-in state with the aid of the precision dividing device (1) and the abutment (6) and is arrested in this position for the grinding of the second end face. The same procedure is followed correspondingly with the remaining end faces.

Using the smooth edge sections (15) as stop faces, the plate lies so accurately and angularly in the apparatus that it is possible to work with a minimal grinding feed of only 0.1–0.2 mm and consequently inexpensively. All the disadvantages of an inferior end face are avoided.

The apparatus allows not only a single plate but also a plurality of plates to be clamped in and ground simultaneously.

In the case of the first development represented above, by means of (multi-head) lasers the outer and inner contours can be produced in one clamping operation with extreme precision by laser scoring or/and laser cutting and consequently the disadvantages of the prior art can be avoided. In addition, the grinding process can be dispensed with. However, in the case of laser cutting of the outer edges, greatly increased working times are accepted, which causes costs, since laser cutting takes about 10 times as long as laser scoring. In addition, it must be taken into account that during laser cutting considerable energy is introduced into the plate in a punctiform manner and that thermostresses cause microcracks which impair the strength of the plate.

The second development likewise allows the plates to be worked inexpensively and in one clamping operation on a multi-head laser. When grinding the end faces, however, each plate must be placed on individually, measured, aligned and then ground.

In this case, high expenditure on measuring and control electronics and mechanics is necessary. In addition, the theoretical performance of the grinding machine is greatly restricted by the time-consuming positioning operation and the individual working.

The third method combines all the abovementioned advantages and allows the avoidance of disadvantages. The plates can be lasered in one clamping operation, utilizing the full laser capacity of multi-head lasers. The time-consuming and cost-intensive cutting through of the outer contour is restricted to three small smooth edge sections, i.e. only to a fraction of the periphery.

With the aid of these three stop points, a plurality of plates can be simultaneously clamped into the clamping mechanism and worked to the closest of tolerances.

Consequently, it is possible to work with a very small grinding feed, whereby the grinding costs can be considerably reduced.

The processes dealt with were used in order to obtain in each case 100 sections of 10×10 cm from ceramic plates (96% $Al_2O_3$, thickness 0.63 mm). The accuracies of the sections obtained are observed and compared in the following tables.

| Method | 1 | 2 | 3 | Prior Art |
|---|---|---|---|---|
| Parallelism of inner to outer contour (values in %): | | | | |
| Mean value | 0.027 | 0.041 | 0.027 | 0.066 |
| Spread | 0.0203 | 0.0262 | 0.0185 | 0.0443 |
| Minimum value | 0.002 | 0.000 | 0.001 | 0.011 |
| Maximum value | 0.075 | 0.074 | 0.067 | 0.168 |
| Angular deviation (values in %): | | | | |
| Mean value | 0.012 | 0.011 | 0.008 | 0.06 |
| Spread | 0.0080 | 0.0071 | 0.0067 | 0.027 |
| Maximum value | 0.02 | 0.02 | 0.02 | 0.12 |

The process according to the invention can be used for improving substrates of all types, whether metal, plastic or ceramic and also for composite materials, such as for example circuit boards or metallized ceramic, and ceramic laminates (multilayers and monoliths of small height, for example chip housings, piezo elements, sensors and heat exchangers). Plates are understood here to mean both boards for microelectronics and as a base for other intended uses in the general sense and also as laminates of small height.

We claim:

1. A process for producing a plate from a brittle material which can be individually separated by breaking to form one or more smaller platelets, wherein laser scoring is used to produce in a single plate of large dimensions a parallel first predetermined breaking points respectively at the distance $d_a$ and b parallel second predetermined breaking points respectively at the distance $d_b$, which intersect the first predetermined breaking points, a and b being integers over 1, the border zone is removed in the outer region at the distance $d_a$ from the two outer first predetermined breaking points and at the distance $d_b$ from the two outer second predetermined breaking points, so that the remaining plate, without border pieces, contains $(a-1) \times (b-1)$ platelet sections of the same size, which are bounded by in each case four predetermined breaking points.

2. The process as claimed in claim 1, wherein a rectangular plate is used and the first and the second predetermined breaking points are arranged in such a way that they run perpendicularly to each other, so that the remaining plate is rectangular and can be individually separated into rectangular platelet sections of the same size.

3. The process as claimed in claim 2, wherein ceramic is used as the material of the rectangular single plate.

4. The process as claimed in claim 2, wherein a clearance is produced in the rectangular platelet sections of the remaining plate by laser cutting.

5. The process as claimed in claim 1, wherein at least one hole is produced in the platelet sections of the remaining plate by laser drilling.

6. The process as claimed in claim 1, wherein the border zone is cut off by means of a laser.

7. The process as claimed in claim 1, wherein the plate is laser-scored for removal of the border zone, maintaining during this outer laser scoring a distance which is slightly greater than the distance $d_a$ or $d_b$, the border zone produced by laser scoring is broken off and the rupture edges of the plate produced during breaking off are ground down until the distance from the next predetermined breaking point is exactly $d_a$ or $d_b$, respectively.

8. The process as claimed in claim 7, wherein at least three narrow clearances are made by laser cutting at the outer predetermined breaking points produced by laser scoring, of which clearances at least two are arranged on the same side and at least one is arranged on a neighboring side.

9. The process as claimed in claim 8, wherein the narrow clearances touch from the outside the outer predetermined breaking points produced by laser scoring.

10. The process as claimed in claim 8, wherein the center axes of the narrow clearances have the same position as the outer predetermined breaking points produced by laser scoring.

11. The process as claimed in claim 8, wherein a multiplicity of rectangular plates of which the border zone produced by laser scoring has been broken off are stacked one on top of the other in such a way that the contours of corresponding narrow clearances lie one above the other, the stack is compressed and corresponding outer contours of the rectangular plates are straightened simultaneously by grinding.

12. The process as claimed in claim 1, wherein the border zone is sawn off, maintaining during sawing a distance from the next predetermined breaking points which corresponds to the distance $d_a$ or $d_b$, respectively.

13. The process as claimed in claim 1, wherein the plate remaining after removing the border zones is at least partially printed with metal paste and the latter is burned in.

* * * * *